United States Patent
Hekstra et al.

(10) Patent No.: US 8,410,960 B2
(45) Date of Patent: Apr. 2, 2013

(54) METHOD TO LINEARIZE THE OUTPUT FROM AN ADC

(75) Inventors: Andries Pieter Hekstra, Eindhoven (NL); Lucien Johannes Breems, Eindhoven (NL); Robert Rutten, Uden (NL)

(73) Assignee: NXP B.V., Eindhoven (NL)

(*) Notice: Subject to any disclaimer, the term of this patent is extended or adjusted under 35 U.S.C. 154(b) by 163 days.

(21) Appl. No.: 13/055,882

(22) PCT Filed: Jul. 28, 2009

(86) PCT No.: PCT/IB2009/053273
§ 371 (c)(1),
(2), (4) Date: Jan. 25, 2011

(87) PCT Pub. No.: WO2010/013196
PCT Pub. Date: Feb. 4, 2010

(65) Prior Publication Data
US 2011/0122005 A1  May 26, 2011

(30) Foreign Application Priority Data

Jul. 28, 2008 (EP) .................................. 08104889

(51) Int. Cl.
*H03M 1/06* (2006.01)
(52) U.S. Cl. .......................... 341/118; 341/120; 341/155
(58) Field of Classification Search .................. 341/143, 341/144, 155, 118, 120
See application file for complete search history.

(56) References Cited

U.S. PATENT DOCUMENTS

| | | | |
|---|---|---|---|
| 6,229,467 B1 * | 5/2001 | Eklund et al. | 341/120 |
| 6,271,781 B1 * | 8/2001 | Pellon | 341/143 |
| 6,445,319 B1 * | 9/2002 | Bugeja | 341/138 |
| 7,129,879 B1 | 10/2006 | Glibbery | |
| 7,330,141 B2 | 2/2008 | Temerinac et al. | |
| 2005/0156766 A1 | 7/2005 | Melanson | |
| 2005/0219089 A1 | 10/2005 | Batruni | |

FOREIGN PATENT DOCUMENTS

| | | |
|---|---|---|
| EP | 1 359 567 A1 | 11/2003 |
| EP | 1 447 913 A1 | 8/2004 |
| WO | 2007/113735 A1 | 10/2007 |

OTHER PUBLICATIONS

Stenbakken, G. et al. "Linear Error Modeling of Analog and Mixed-Signal Devices," Proc. of the Int'l. Test Conference, Nashville, TN, IEEE US, pp. 573-81 (1991).

(Continued)

*Primary Examiner* — Peguy Jean Pierre
(74) *Attorney, Agent, or Firm* — Kramer & Amado PC

(57) ABSTRACT

A method is disclosed of compensating the output of an ADC for non-linearity in the response of the ADC. The method comprises converting an analog input signal to uncorrected digital ADC output samples, applying a vector of correction variables to each of a block of uncorrected ADC output samples to provide a block of corrected ADC samples, and iteratively minimizing a measure of the spectral flatness of the block of corrected ADC samples with response to the vector of correction variables.

12 Claims, 6 Drawing Sheets

OTHER PUBLICATIONS

Chou, W. et al. "Modulo Sigma-Delta Modulation," IEEE Trans. on Communications, vol. 40, No. 8, pp. 1388-1395 (Aug. 1992).

Sousa, M. et al. "Performance Analysis for Innovations-Based Detection," The Institution of Electrical Engineers, Stevenage, GB, pp. V-361 to V-364 (1992).

Adamo, F. et al. "A/D Converters Nonlinearity Measurement and Correction by Frequency Analysis and Dither," IEEE Trans. on Instrumentation and Measurement, vol. 52, No. 4, pp. 1200-1205 (Aug. 2003).

Hong, H-C., "A Design-for-Digital-Testability for Circuit Structure for $\Sigma$-$\Delta$ Modulators," IEEE Trans. on Very Large Scale Integration (VLSI) Systems, 10 pgs. (2007).

International Search Report and Written Opinion for Int'l. Patent Appln. No. PCT/IB2009/053273 (Feb. 19, 2010).

\* cited by examiner

METHOD TO LINEARIZE THE OUTPUT FROM AN ADC

FIELD OF THE INVENTION

This invention relates to analog-to-digital converters (ADC), and in particular to methods for linearizing the corrected output from such ADCs.

BACKGROUND OF THE INVENTION

The analog-to-digital converter is a class of electronic component which is used in a wide variety of applications ranging from instrumentation to communications. The basic function of an ADC is to accept an input which is analog—that is to say, it can have any of a continuous range of values—and provide an output in a digital form—that is to say, the output must lie within a representation of a subset of the natural numbers.

In order to properly carry out their function, the vast majority of ADCs are required to be as nearly as possible, or at least approximately, linear: the output should be directly proportional to the input.

An example of an ADC which requires high linearity is that for a single frequency modulated (FM) radio signal, which requires to be linear over the range of frequency modulation from the base band frequency. In comparison, an ADC used in a wide band receiver requires linearity over a far wider range: the wide band receiver will sample the entire 20 MHz FM relevant radio band, such as, for instance, a 20 MHz FM radio band. In addition, such a wide band receiver may be exposed to the "near-far problem" in that it may receive signals from antennas at widely different distances from the receiver: the ADC should be capable of digitising signals from both the distant and nearby antenna accurately. Relative to ADCs for narrowband applications, an ADC for such a wide band receiver application thus not only needs to have a much larger bandwidth, but also requires a much higher "spurious free dynamic range" (SFDR). To achieve this requires a very high degree of linearity.

Non-linearity in an ADC response can arise due to a variety of factors. In particular, deviations in the actual resistance or capacitance values of manufactured on-chip components such as resistors or capacitors, from the design values, can directly result in non-linearity. These deviations can easily arise due to IC process spread, moreover currents which exceed the (small signal) approximations of transistors may also degrade the linearity. Examples are non-linear circuit parameters in multi-level quantizers and digital to analogue converters (DACs).

In general, the non-linearities of an ADC may be classified into static non-linearities, which manifest themselves for constant input signals, and dynamic non-linearities that only manifest themselves for time-varying signals. Histograms of the digital sample values for a known input signal can characterize ADCs with static non-linearities. However, such tests are inadequate to measure ADCs with dynamic errors like hysteresis.

Historically, addition of a controlled amount of noise to the ADC input, called dithering, has been a popular technique to reduce the non-linearity of ADCs. Dithering is mostly used for suppression of non-linearities in ideal ADCs.

A known method of carrying out linearization of ADCs is to use one of a variety of spectra. Typically such spectra are generated as Fast Fourier Transforms (FFT), but other spectra, such as Discrete Cosine Transforms (DCT) may also be used. For example, Adamo et al in "A//D Converters Nonlinearity Measurement and Correction by Frequency Analysis and Dither," *IEEE Tr. Instrumentation Measurement*, Vol. 52, No. 4, August 2003 assumes a polynomial non-linearity in the ADC, for which a single carrier at the ADC input causes a series of harmonics in the ADC output. Based on this assumption, Adamo et al analytically determined the energies of these harmonics.

Dynamic element matching (DEM) is a kind of randomization technique that reduces harmonics and intermodulation products in non-ideal ADCs at the expense of a higher noise floor.

This invention is particularly concerned with sigma delta ($\Sigma\Delta$) ADCs. $\Sigma\Delta$ modulation is a variation of delta ($\Delta$) modulation: the basic form of the two forms of modulation, as applied to a single stage in an ADC, is shown in FIG. 1. In a $\Delta$ modulator, an analogue input signal is quantized in quantizer 2, typically to produce a single bit of the digital output signal, although in some known $\Delta$ modulators multiple bits may be produced. The resulting quantized signal is subtracted from the original input signal at the ($\Sigma$) adder 1, resulting in a remnant or $\Delta$ signal which is equal to the original signal less the quantized (bit) output. This $\Delta$ signal is fed back to the quantizer, for the next stage of the ADC conversion. The subsequent quantizer output (of the $\Delta$ signal) is integrated along with the original quantized output, by means of integrator 4, and finally the output is filtered in a low pass filter 5. The $\Sigma\Delta$ variation is based on the realisation that integration is a linear operation: that is to say, the integral of (a+b) is equal to (the integral of a)+(the integral of b). And thus the integrator 3' may be included in the circuit between the adder ($\Sigma$) and the quantizer 2.

It is known, for example from the Adamo paper referenced above, to minimise the energy of harmonics in the ADC output signal corresponding to a sine wave ADC input. It is also known to use iteratively the inverses of polynomials. However, these methods require precise knowledge of the input frequency which also needs to fall on the grid of fast Fourier transform (FFT) frequencies corresponding to the sine wave input.

There is thus an ongoing requirement for a linearization method which does not suffer to the same extent from these requirements.

SUMMARY OF THE INVENTION

It is an object of the present invention to provide a method for linearization of an ADC which does not suffer, to the same extent, from the above disadvantages.

According to the present invention there is provided a method of compensating the output of an ADC for non-linearity in the response of the ADC, the method comprising converting an analog input signal to uncorrected digital ADC output samples applying a vector of correction factors to each of a block of uncorrected ADC output samples, to provide a block of corrected ADC samples, and iteratively minimizing a measure of the spectral flatness of the block of corrected ADC samples with respect to the vector of correction variables.

Preferably the analog signal comprises a plurality of frequencies.

Advantageously the ADC is a $\Sigma\Delta$ ADC comprising a quantizer and ADC which together form a loop filter. Preferably the step of iteratively minimizing the spectral flatness of the block of corrected ADC samples with respect to the vector of correction variables comprises: estimating a mismatch function V of the quantizer and a mismatch function W of the DAC, estimating the impulse response h of the loop filter determining a first impulse response f and a second impulse response g, wherein f and g follow the follow relationships:

$$f(k)=\delta(k)-\Sigma_{i=1}^{P}h(i)f(k-i),$$

$$g(k)=\Sigma_{i=1}^{P}h(i)f(k-i).$$

wherein δ is the Kronecker −Δ function, and iteratively subtracting a correction sample e from the uncorrected ADC output samples, wherein e obeys the relationship $$e(k) = \sum_{s=10}^{L-1} V(y(k)) * f(k) + W(y(k)) * g(k),$$

wherein * denotes the convolution of two functions.

Preferably, the measure of spectral flatness is the spectral flatness) $\lambda(\vec{Z})$ of a spectrum $\vec{Z}$ according to:

$$\lambda(\vec{Z}) = \frac{\exp\left(\frac{1}{N}\sum_i \log(|Z_i|^2)\right)}{\frac{1}{N}\sum_i |Z_i|^2}.$$

Alternatively, the measure of spectral flatness may be given by a generalised spectral flatness of the spectrum $\vec{Z}$ (with p<q):

$$\lambda_{p,q}(\vec{Z}) = \frac{\left(\frac{1}{N}\sum_i |Z_i|^p\right)^{\frac{1}{p}}}{\left(\frac{1}{N}\sum_i |Z_i|^q\right)^{\frac{1}{q}}}.$$

Preferably the compensation is applied over a frequency range of at least minus 200 MHz to 200 MHz. Linearization over such a wide range of frequency is particularly difficult using conventional methods.

More preferably still the compensation is applied over a frequency range of approximately or exactly 0 Hz to approximately or exactly 20 MHz. Application of the method over a frequency range of this order makes the method particularly suitable for wideband receiver applications.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
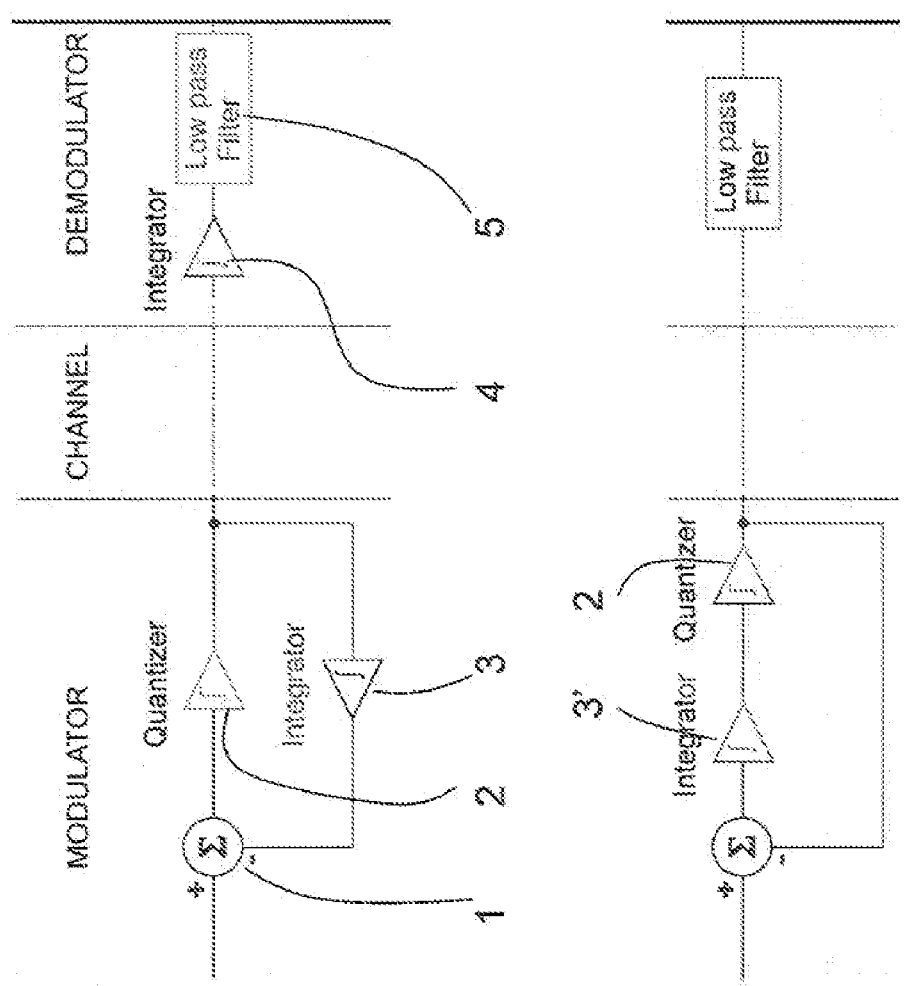
FIG. 1 shows schematically typical Δ and ΣΔ modulators used in ADC stages.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments

DETAILED DESCRIPTION OF EMBODIMENTS

The ADC output signal during a training phase has a finite length; that during the operational phase has a semi-infinite length. For a block of samples of the signal x(k), k=0, 1, . . . , the vector notation $\vec{x}=(x_0, x_1, \ldots, x_{N-1})$ will be used. The corresponding fast Fourier transform (FFT) spectrum is denoted $\vec{X}=(X_0, X_1, \ldots, X_{N-1})$. δ(k) is the Kronecker delta function, such that δ(k)=0, except for δ(0)=1.

We assume that the impulse response h(k) of the ΣΔ-loop filter satisfies h(k)=0 for k=0, −1, . . . due to causality and a minimal one unit delay in the loop. Truncate the estimate of h to at most P non-zero (complex) samples, such that $$h(k)=0 \text{ for } k=P+1, P+2 \ldots.$$

The transfer function of the loop is denoted H=FFT$_N$(h).

Figure 2:
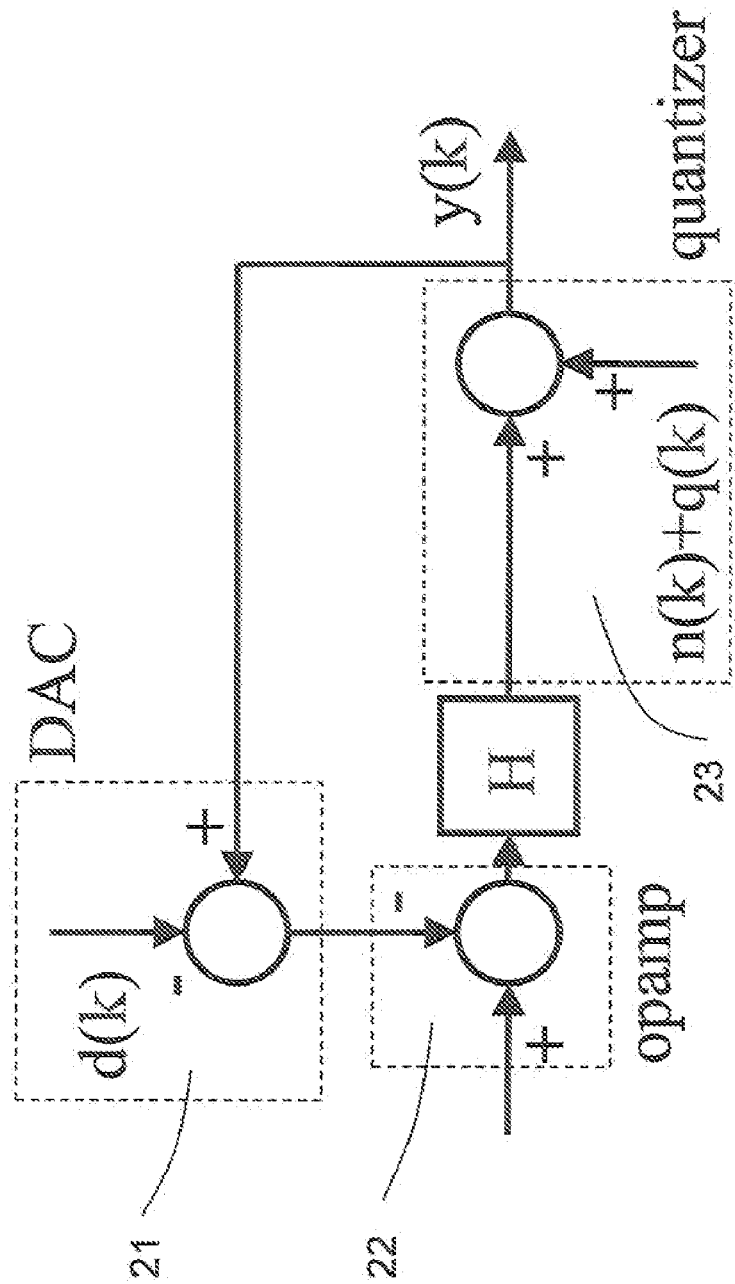
FIG. 2 shows a ΣΔ feedback loop as applied in the present inventions.

FIG. 2 depicts the additive errors due to mismatch in the quantizer and DAC inside a ΣΔ feedback loop.

In FIG. 2 the DAC 21 introduces, negatively, an error d(k); this error is fed through the integrator off amp 22 to the quantizer 23, at which an additional noise signal n(k) is introduced.

We now let y(k) represent the integer samples produced by the L-level quantizer in response to the test signal during the training phase. That is to say: $y_k \in S=\{0, 1, \ldots, S-1\}$. Indicator signals $i^{(s)}(k)$, s∈S, are defined as follows.

$$i^{(s)}(k)=1 \text{ if } y_k=s, \text{ and } 0 \text{ otherwise} \quad (1)$$

A weighted sum of the indicator signals $i^{(s)}(k)$ equals y(k), $$y(k) = \sum_{i=0}^{L-1} s i^{(s)}(k). \quad (2)$$

After point-wise multiplication "o" with e.g. a Blackman window w(k), the FFTs of the indicator signals are computed, $$\vec{I}^{(s)}=FFT_N(\vec{w} \circ \vec{i}^{(s)}). \quad (3)$$

The linearity of the FFT as applied to Equation (2) yields that $$FFT_N(\vec{w} \cdot \vec{y}) = \sum_{i=0}^{L-1} s \vec{I}^{(s)}. \quad (4)$$

The quantization noise if the quantizer had been ideal is denoted n(k), see FIG. 2. The mismatch error signal q(k) at the input of an non-ideal quantizer is estimated with a function V of the current quantizer output sample y(k), that is q(k)=V(y(k)). Similarly, the mismatch error signal e(k) at the input of a non-ideal DAC is estimated by means of a function W of the current quantizer output sample y(k), that is d(k)=W(y(k)). Observe, that the spectra of q(k) and d(k) follow from equation (4), $$E_q = \sum_{i=0}^{L-1} V(s) \vec{I}^{(s)}, E_d = \sum_{i=0}^{L-1} W(s) \vec{I}^{(s)}. \quad (5)$$

From FIG. 2 it is apparent that q(k) and d(k) are convolved with impulse responses f(k) and g(k), $$f(k)=\delta(k)-\Sum_{i=1}^P h(i)f(k-i),$$

$$g_{k+1}=\Sum_{i=1}^P h_i f_{k-i},$$

before they reach the quantizer output of the $\Sigma\Delta$-loop, respectively.

In the frequency domain, the corresponding transfer functions are $$F(f)=1/(H(f)+1), G(f)=H(f)F(f),$$

respectively. Note that for moderate loop gains, we cannot approximate $F(f)\approx 1$, $G(f)\approx 0$.

Now, Equation (5) implies that the total ADC output error spectrum equals $$\vec{E} = \sum_{i=0}^{L-1} (V(s)\vec{F} + W(s)\vec{D}\cdot\vec{G})\cdot \vec{I}^{(s)}, \quad (7)$$

where D(f) is the Fourier transform of a unit delay function, $$D(f)=e^{j2\pi f/N}, f=0, 1, \ldots, N-1.$$

The right hand side of the Equation (7) can be interpreted as a vector-matrix product of a vector of length L with a L×N-matrix whose rows consist of the vectors $\vec{I}^{(s)}$.

As our sources of nonlinearity are filtered, both static and dynamic nonlinearities can occur. Subtraction of the error spectrum $\vec{E}$ from the ADC output spectrum $\vec{Y}$ yields the spectrum of the linearized signal, $\vec{Z} = \vec{Y} - \vec{E}$.

Due to IC process spread, the impulse response h of the loop filter varies from chip to chip, and, in general, needs to be estimated. Other variables that need to be estimated during the training phase are the values of the functions V and W. They can be viewed as tables with S entries each. Once V, W, and h are known, f and g follow from Equation (6).

For moderate degrees of nonlinearity of the operational amplifier (opamp) that subtracts the ADC input signal from the DAC output signal in a $\Sigma\Delta$-loop, computer simulations show that they can be corrected for implicitly, by letting them impact the estimates of mismatch function values V, W of the quantizer and DAC.

The spectrum flatness (measure) (SF) $\lambda(\vec{Z})$ of the spectrum $\vec{Z}$ is defined as [10]

$$\lambda(\vec{Z}) = \frac{\exp\left(\frac{1}{N}\sum_i \log(|Z_i|^2)\right)}{\frac{1}{N}\sum_i |Z_i|^2}. \quad (8)$$

In general, $0 \leq \lambda \leq 1$, where $\lambda=1$ occurs only for signals with a perfectly white spectrum. Small $\lambda$'s correspond to estimates $|Z_i|^2$, $i=0, 1, \ldots, N-1$ of the power spectral density (PDS) with all energy concentrated in a small number of spectral peaks. When in Equation (8) a small constant $\epsilon$, $\epsilon>0$, (e.g. a noise variance) is added to the PSD, only logarithms of positive values occur. Averaging power spectra of blocks makes the estimate of the PSD more accurate.

Important for this embodiment of the invention is to iteratively minimise the spectral flatness SF of a block of corrected ADC output samples over the correction variables. It is noted that in order to carry this out, quantitative knowledge about the ADC input sample is not required.

Incremental (or multiplicative) steps in the correction variables yield new corrected versions of the block of ADC output samples. The search follows the steps that lower the SF-value and discards others. In case of gradient-descent minimization, the gradient can be evaluated numerically. Too large steps along the gradient vector increase the SF.

During the operational phase of the linearization method we subtract the correction samples $$e(k) = \sum_{s=10}^{L-1} V(y(k)) * f(k) + W(y(k)) * g(k), \quad (9)$$

from the ADC output samples y(k) to obtain the corrected samples z(k)=y(k)−e(k), where "a"(k)*"b"(k) denotes convolution of the functions k→"a"(k) and k→"b"(k).

In an alternative embodiment of the invention, a generalised spectral flatness measure (GSF) is implemented rather than the SF described above.

A Generalized Spectral Flatness Function is a function of a power) spectrum, typically a power spectrum, that takes on its maximal value for a spectrally flat input signal, and takes on its minimal value, or values close to its minimal value, for input signals that are maximally peaked. A GSF will have a monotonic behaviour in between these two extrema. Hence, if a signal's spectrum gets to have either fewer peaks or larger peaks, the GSF decreases as the spectrum has larger deviation from a flat spectral shape.

A ratio of two functions, in which, as the spectrum becomes more peaked, the denominator increases relatively stronger than the nominator provides a measure of the "flatness" of the spectrum. For instance, a ratio (with p<q)

$$\lambda_{p,q}(\vec{Z}) = \frac{\left(\frac{1}{N}\sum_i |Z_i|^p\right)^{\frac{1}{p}}}{\left(\frac{1}{N}\sum_i |Z_i|^q\right)^{\frac{1}{q}}}. \quad (11)$$

is invariant to scaling of the spectrum. Dividing by a mean—that is to say, setting p=1 in equation 11, such that the numerator denotes the mean—and a root mean square value, that is to say, setting q=2 in equation 11, such that the denominator denotes the root mean square, minimizes the number of multiplications and their numerical range.

In order to demonstrate the effectivity of the method, it has been applied by means of computer simulations, as follows. Gaussian mismatch values were introduced in the quantizer and DACs inside a wide band FM ADC. The standard deviations were equal to 5% and 1% of the difference between the levels of the 16-level quantizer and DAC, respectively. Both ADC stages were simulated. The search procedure also optimized the noise cancellation filter. Moderate third order non-linearities were introduced in the opamps that subtract the ADC input signals from the DAC output signals. Thermal noise was modelled by the addition of Gaussian noise to the ADC input signals.

Figure 3:
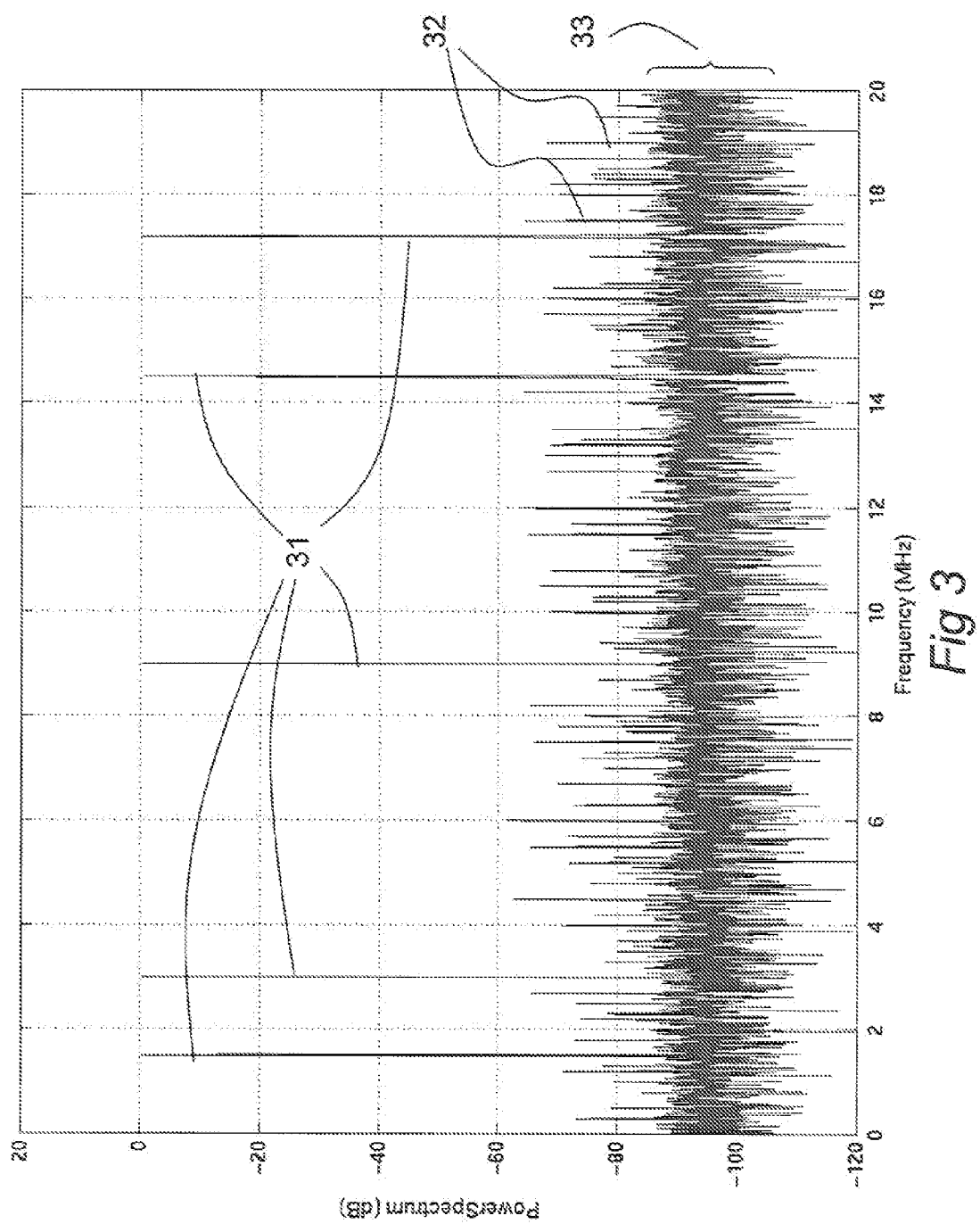
FIG. 3 shows a spectrum of a training signal comprising five carriers prior to the linearization operation.
Figure 4:
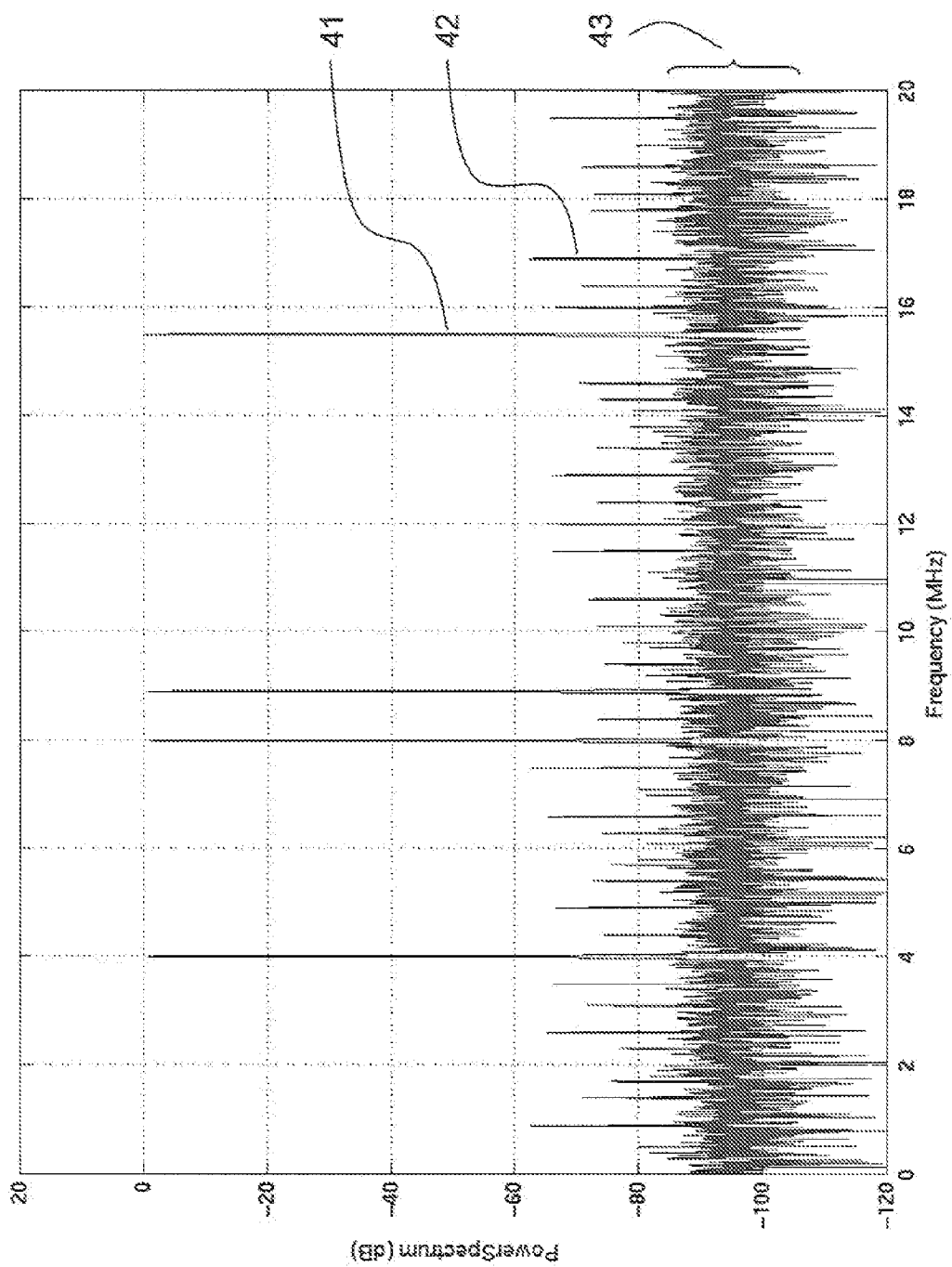
FIG. 4 shows the spectrum of an operational signal comprising four carriers prior to linearization according to the method of the invention.

The training and operational ADC input signal consisted of five and four carrier signals respectively. Given the short time that was simulated (0.3 ms), FM modulation of these carriers by audio signals had not made a difference. For the sake of brevity, the input signals are not shown. FIGS. 3 and 4 show the spectra $\vec{Y}$ of around 150k samples of the ADC output signals. FIG. 3 shows the training spectrum including 5 carrier signals 31, at 0 dB, along with a noise level 33 at around −90 dB; the error spectra 32, comprising multiple peaks at between −90 dB ad −65 dB, is also clearly apparent. FIG. 4 shows a corresponding operational spectrum for four signal carriers 41 at 0 dB; again, the error peaks 42 are apparent above the noise level 43

Figure 5:
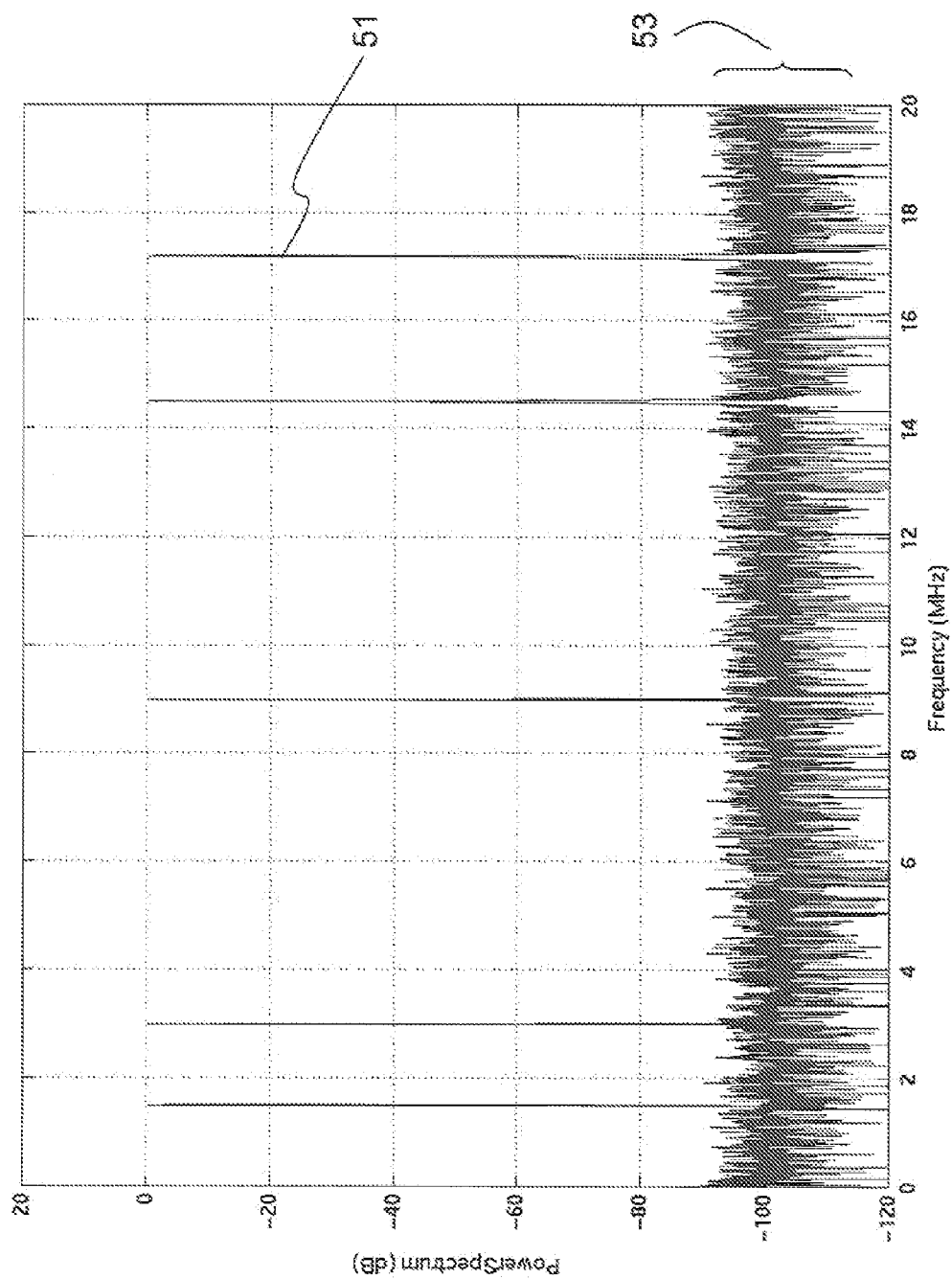
FIG. 5 shows the spectrum of the training signal of FIG. 3 after application of the method according to the invention.
Figure 6:
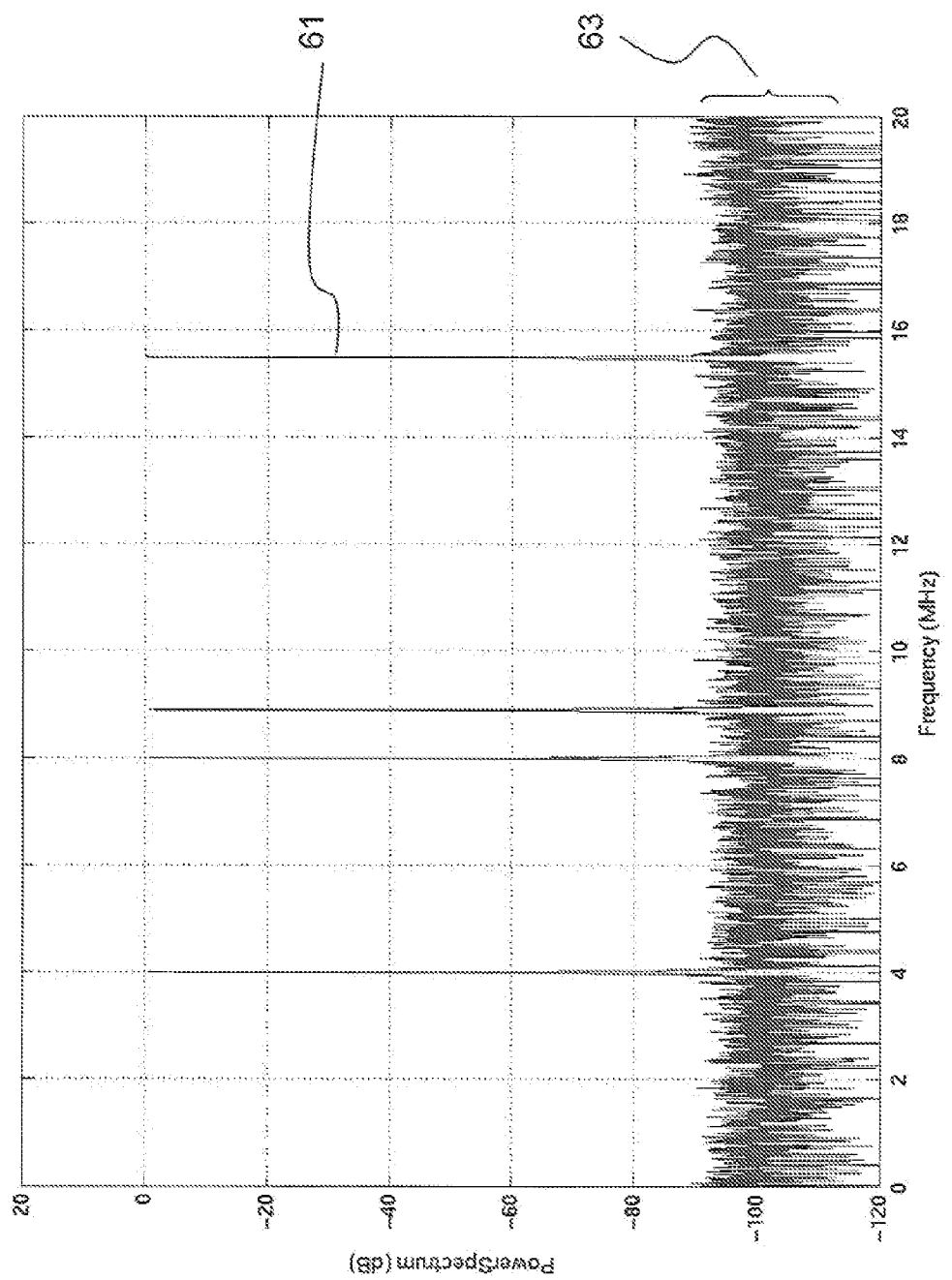
FIG. 6 shows the spectrum of the operational signal of FIG. 4 after application of linearization according to the method of the present invention.

The correction parameters were varied so as to minimize the GSF, as given by Equation (11) with p=1, q=2, of the training signal shown in FIG. 3. The pertaining corrected signal $\vec{Z}$ is shown in FIG. 5. The absence of error peaks above the noise level 53 (at about −90 dB) is remarkable, thus providing a 90 dB differential between the carrier signals 51, and the noise background 53. Using the same correction parameters, the operational signal of FIG. 4 was corrected. This yielded the signal of FIG. 6. Again, the absence of absence of error peaks above the noise level 63 (at about −90 dB) is apparent, providing a 90 dB differential between the carrier signals 61, and the noise background 63.

The main computational complexity of the method is in the (implicit) vector-matrix product in Equation (7) inside the search loop. Due to the over-sampling in the ADC, the FFT spectra originally have a frequency range of −218.4 MHz to +218.4 MHz, whereas for the evaluation of the GSF, only a "payload" frequency range of 0 Hz to 20 MHz is needed. Hence, in this embodiment of the invention, the original width N of the matrix in the vector-matrix product can be drastically reduced.

In summary, then, the method described above according to embodiments of the invention comprises minimising the spectral flatness of the corrected ADC output signal, over a vector of parameters of a post processing unit. The method implicitly minimises the energy in spurious components due to mismatch of multi-level quantizers and DACs and moderate operational amplifier non-linearities in ΣΔ ADCs.

Although the method has been described above in relation to a ΣΔ ADC, it should be noted that the invention is not limited thereto. In particular, the method according to the invention may be used with other ADCs, including, but not limited to, oversampled ADCs and Nyquist rate converters.

From reading the present disclosure, other variations and modifications will be apparent to the skilled person. Such variations and modifications may involve equivalent and other features which are already known in the art of ADCs and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of compensating an output of an Analog-to-Digital Converter (ADC) for non-linearity in a response of the ADC, the method comprising:
   converting an analog input signal to uncorrected digital ADC output samples;
   applying a vector of correction variables to each of a block of the uncorrected digital ADC output samples and producing a block of corrected ADC samples; and
   iteratively minimizing a measure of a spectral flatness of the produced block of corrected ADC samples with respect to the vector of correction variables.

2. The method according to claim 1, wherein the analog input signal comprises a plurality of frequencies.

3. The method according to claim 1, wherein the ADC is a sigma delta ADC comprising a quantizer and a DAC which together form a loop filter.

4. The method according to claim 3, wherein the step of iteratively minimizing the measure of the spectral flatness of the produced block of corrected ADC samples with respect to the vector of correction variables comprises:
   estimating a mismatch function V of the quantizer and a mismatch function W of the DAC;
   estimating an impulse response h of the loop filter determining a first impulse response f and a second impulse response g, wherein f and g follow the follow relationships:

$$f(k) = \delta(k) - \sum_{i=1}^{P} h(i)f(k-i)$$

$$g_{k+1} = \sum_{i=1}^{P} h_i f_{k-i}$$

wherein $\delta$ is the Kronecker-delta function, and iteratively subtracting a correction sample e from the uncorrected ADC output samples, wherein e obeys the relationship $$e(k) = \sum_{s=10}^{L-1} V(y(k)) * f(k) + W(y(k)) * g(k),$$

wherein * denotes the convolution of two functions.

5. The method according to claim 4, wherein the measure of spectral flatness is the spectral flatness $\lambda(\vec{Z})$ of a spectrum $\vec{Z}$ according to:

$$\lambda(\vec{Z}) = \frac{\exp\left(\frac{1}{N}\sum_i \log(|Z_i|^2)\right)}{\frac{1}{N}\sum_i |Z_i|^2}.$$

6. The method according to claim 4, wherein the measure of spectral flatness is given by a generalized spectral flatness of the spectrum $\vec{Z}$:

$$\lambda_{p,q}(\vec{Z}) = \frac{\left(\frac{1}{N}\sum_i |Z_i|^p\right)^{\frac{1}{p}}}{\left(\frac{1}{N}\sum_i |Z_i|^q\right)^{\frac{1}{q}}}.$$

7. The method according to claim 4, wherein the compensation is applied over a frequency range of at least −200 MHz to 200 MHz.

8. The method according to claim 4, wherein the compensation is applied over a frequency range of at least approximately 0 Hz to at least approximately 20 MHz.

9. The method of claim 1, wherein the step of iteratively minimizing further comprises:

selectively applying incremental steps to correction variables.

10. The method of claim 9, further comprising:

following incremental steps that lower the measure of the spectral flatness and discarding other incremental steps.

11. The method of claim 1, wherein the step of iteratively minimizing further comprises:

performing gradient-descent minimization.

12. The method of claim 11, further comprising:

evaluating a gradient numerically.

* * * * *